United States Patent
Van De Graaff et al.

(10) Patent No.: US 11,644,977 B2
(45) Date of Patent: May 9, 2023

(54) LIFE EXPECTANCY MONITORING FOR MEMORY DEVICES

(71) Applicant: Micron Technology, Inc., Boise, ID (US)

(72) Inventors: Scott D. Van De Graaff, Boise, ID (US); Todd Jackson Plum, Boise, ID (US); Scott E. Schaefer, Boise, ID (US); Aaron P. Boehm, Boise, ID (US); Mark D. Ingram, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/365,013

(22) Filed: Jul. 1, 2021

(65) Prior Publication Data
US 2022/0035535 A1 Feb. 3, 2022

Related U.S. Application Data

(60) Provisional application No. 63/057,782, filed on Jul. 28, 2020.

(51) Int. Cl.
*G06F 3/06* (2006.01)
(52) U.S. Cl.
CPC .......... *G06F 3/0616* (2013.01); *G06F 3/0659* (2013.01); *G06F 3/0679* (2013.01)
(58) Field of Classification Search
CPC .... G06F 3/0616; G06F 3/0653; G06F 3/0659; G06F 3/0679; G06F 12/0238;
(Continued)

(56) References Cited

U.S. PATENT DOCUMENTS 5,603,001 A * 2/1997 Sukegawa ............. G06F 3/0601
714/E11.038
7,447,944 B2 11/2008 Hu
(Continued)

OTHER PUBLICATIONS

ISA/KR, International Search Report and Written Opinion of the International Searching Authority, Int'l Appl. No. PCT/US2021/040334, Oct. 22, 2021, Korean Intellectual Property Office, Seo-gu, Daejeon, Republic of Korea, 10pgs.

*Primary Examiner* — Larry T Mackall
(74) *Attorney, Agent, or Firm* — Holland & Hart LLP

(57) ABSTRACT

Methods, systems, and devices for life expectancy monitoring for memory devices are described. Some memory devices may degrade over time, and this degradation may include or refer to a reduction of an ability of the memory device to reliably store, read, process, or communicate information, among other degradation. In accordance with examples as disclosed herein, a system may include components configured for monitoring health or life expectancy of the memory device, such as components that perform comparisons between signals or other operating characteristics resulting from operating at the memory device and one or more threshold values that may be indicative of a life expectancy of the memory device. In various examples, a memory device may perform a subsequent operation based on such a comparison, or may provide an indication of a life expectancy to a host device based on one or more comparisons or determinations about health or life expectancy.

25 Claims, 9 Drawing Sheets

(58) Field of Classification Search
CPC .......... G11C 11/4072; G11C 11/4076; G11C 11/4078; G11C 29/50; G11C 2029/0409; G11C 2029/5002
See application file for complete search history.

(56) References Cited

U.S. PATENT DOCUMENTS

| | | |
|---|---|---|
| 7,778,077 B2 | 8/2010 | Gorobets et al. |
| 10,541,034 B2 | 1/2020 | Lien et al. |
| 2007/0260811 A1* | 11/2007 | Merry, Jr. ............ G11C 16/349 711/103 |
| 2012/0185638 A1 | 7/2012 | Schreiber et al. |
| 2012/0224404 A1* | 9/2012 | Gurgi ................ G11C 13/0069 365/45 |
| 2014/0317443 A1* | 10/2014 | Bartlett .................. G11C 29/04 714/6.11 |
| 2016/0179407 A1 | 6/2016 | Gorobets et al. |
| 2016/0180908 A1* | 6/2016 | Zhou ................. G11C 11/1677 365/156 |
| 2020/0004434 A1* | 1/2020 | Borlick ............... G06F 11/0727 |

\* cited by examiner

LIFE EXPECTANCY MONITORING FOR MEMORY DEVICES

CROSS REFERENCE

The present application for patent claims the benefit of U.S. Provisional Patent Application No. 63/057,782 by VAN DE GRAAFF et al., entitled "LIFE EXPECTANCY MONITORING FOR MEMORY DEVICES," filed Jul. 28, 2020, assigned to the assignee hereof, and expressly incorporated by reference herein.

BACKGROUND

The following relates generally to one or more systems for memory and more specifically to life expectancy monitoring for memory devices.

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

DETAILED DESCRIPTION

Figure 1:
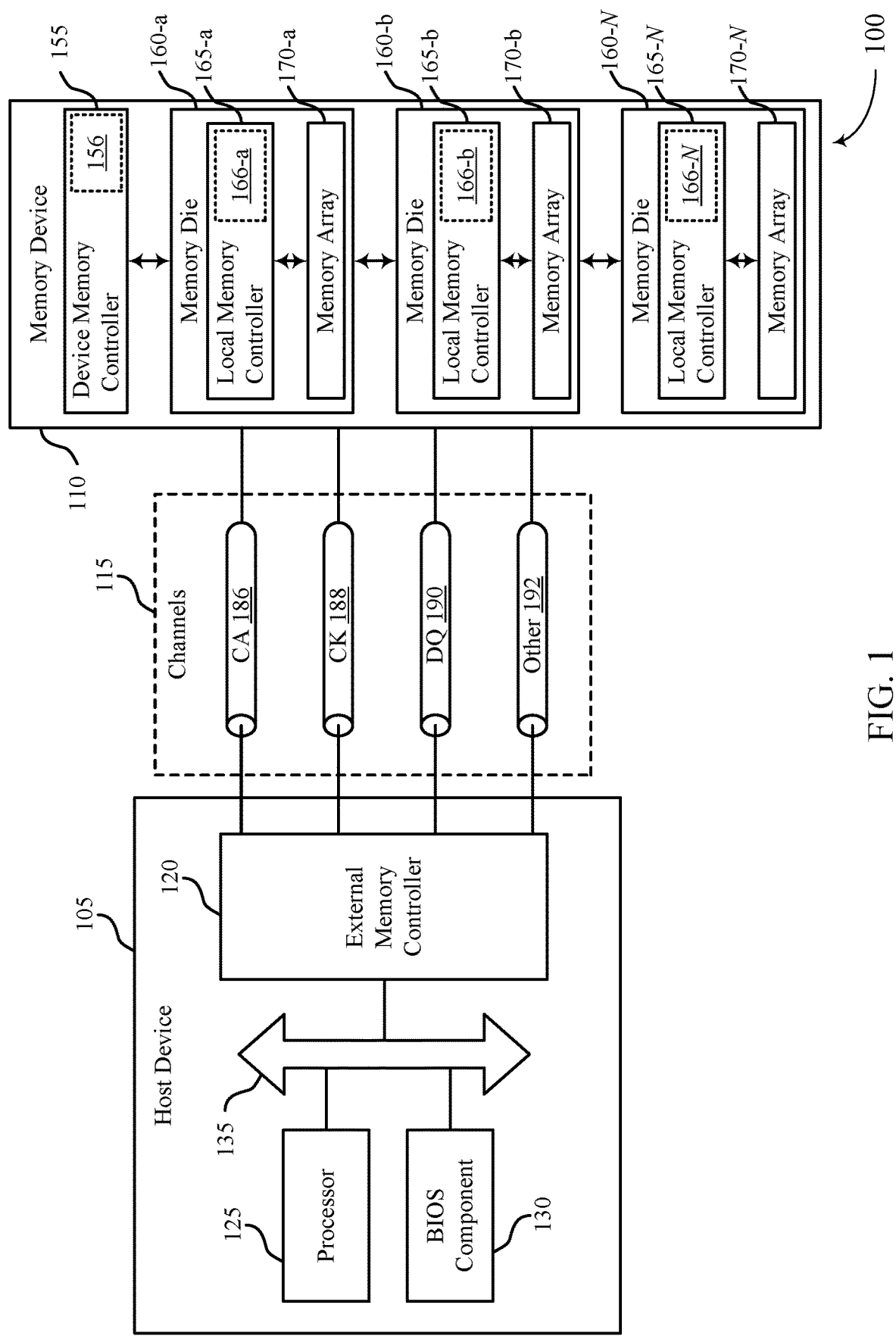
FIG. 1 illustrates an example of a system that supports life expectancy monitoring for memory devices in accordance with examples as disclosed herein.

A memory system in accordance with examples disclosed herein may include a memory device and a host device coupled with the memory device. Reliability of a memory device in such a system may be based on likelihood, for example a statistical probability or projected or calculated reliability information based on measurements or data, of failures at the memory device, which may be referred to as a failure in time (FIT), or other terminology. Some applications, such as vehicle safety systems, autonomous vehicle systems, advanced driver assistance systems (ADAS) or other safety-critical systems, may have particularly high reliability requirements, or may otherwise involve a particularly low probability of failures.

In some memory systems, reliability may be improved when failures are identified, detected, or otherwise proactively handled. For example, if a memory device experiences one hundred failures in a given duration (e.g., a FIT of 100, which may correspond to 100 failures per billion device hours), but all the errors are handled without operational failure (e.g., where all the errors are handled by an error correction algorithm), the memory device may be associated with a zero FIT (e.g., a zero "Safety FIT") or other measure of relatively high reliability (e.g., zero parts-per-million (PPM)). In other words, a memory device that employs techniques for reducing uncertainties associated with failures, or identifies indications of and thus takes a proactive approach with respect to such failures or reliability issues, may have a more favorable reliability compared to a memory device that does not employ such techniques.

Some memory devices may degrade over time, where this degradation may include a reduction of an ability to reliably store information, a reduction of an ability to reliably read information, a reduction of an ability to process information, or a reduction of an ability to communicate information, among other degradations, or some combination thereof. Degradation of a memory device may be associated with a cumulative duration of being powered or accessed, a cumulative duration or quantity of operations over which an operating parameter satisfies a threshold, degrading events, and other conditions. For example, over time, components or circuitry of a memory device may experience dielectric breakdown, ion or other constituent material migration or transformation, thermal stress or damage, mechanical stress or damage, fatigue, or other changes that affect operational reliability of a memory device. Thus, according to these and other examples, memory devices may be associated with a finite life expectancy for supporting access operations.

In accordance with examples as disclosed herein, a memory device may include components configured for monitoring health or life expectancy (or both) of the memory device. Such monitoring may involve components that perform determinations, such as comparisons, between signals or characteristics associated with performing operations at the memory device and one or more threshold values, which may be indicative of a life expectancy of the memory device. For example, a threshold value used in such comparisons may be a proxy that indicates an expected remaining life, such that the comparisons may support a real-time awareness or inference of life expectancy of an operating memory device.

In some examples, the memory device may perform a subsequent operation based at least in part on such a determination (e.g., comparison), such as adjusting an operating parameter of the memory device (e.g., a voltage parameter, a timing parameter), or enabling or disabling circuit components of the memory device (e.g., enabling a redundant circuit component of the memory device). In some examples, the memory device may provide an indication of a life expectancy to a host device, and the host device may determine one or more parameters for performing access operations based on such an indication. In some examples, the memory device may initiate some corrective or altered action based on a determined life expectancy independent of providing an indication of the life expectancy to a host device. By supporting these and other operations related to memory device life expectancy evaluation, an associated system may support various proactive measures to maintain operational reliability, including indicating that a memory device should be replaced, modifying operation of an aging memory device, or selecting a different memory device for operations, among other actions.

Features of the disclosure are initially described in the context of systems and dies as described with reference to FIGS. 1 and 2. Features of the disclosure are described in the context of systems and operations with reference to FIGS. 3-5. These and other features of the disclosure are further illustrated by and described with reference to apparatus diagrams and flowcharts that relate to life expectancy monitoring for memory devices as described with reference to FIGS. 6-9.

FIG. 1 illustrates an example of a system 100 that supports life expectancy monitoring for memory devices in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a slave-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of host device may be in coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies may be referred to as a multi-die memory or a multi-die package or a multi-chip memory or a multi-chip package. The memory device 110

(e.g., the device memory controller 155, one or more memory dies 160, one or more local memory controllers 165, one or more memory arrays 170) may be configured to operate in response to commands from the host device 105 (e.g., from the external memory controller 120, from the processor 125).

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may receive data or commands or both from the host device 105. For example, the memory device 110 may receive a write command indicating that the memory device 110 is to store data for the host device 105 or a read command indicating that the memory device 110 is to provide data stored in a memory die 160 to the host device 105.

A local memory controller 165 (e.g., local to a memory die 160) may include circuits, logic, or components operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165, or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device.

Each channel 115 may be an example of a transmission medium that carries information between the host device 105 and the memory device. Each channel 115 may include one or more signal paths or transmission mediums (e.g., conductors) between terminals associated with the components of system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, CA channels 186 may be operable to communicate commands between the host device 105 and the memory device 110 including control information associated with the commands (e.g., address information). For example, commands carried by the CA channel 186 may include a read command with an address of the desired data. In some examples, a CA channel 186 may include any number of signal paths to decode one or more of address or command data (e.g., eight or nine signal paths).

In some examples, clock signal channels 188 may be operable to communicate one or more clock signals between the host device 105 and the memory device 110. Each clock signal may be operable to oscillate between a high state and a low state, and may support coordination (e.g., in time) between actions of the host device 105 and the memory device 110. In some examples, the clock signal may be single ended. In some examples, the clock signal may provide a timing reference for command and addressing operations for the memory device 110, or other system-wide operations for the memory device 110. A clock signal therefore may be referred to as a control clock signal, a command clock signal, or a system clock signal. A system clock signal may be generated by a system clock, which may include one or more hardware components (e.g., oscillators, crystals, logic gates, transistors).

In some examples, data channels 190 may be operable to communicate one or more of data or control information between the host device 105 and the memory device 110.

For example, the data channels 190 may communicate information (e.g., bi-directional) to be written to the memory device 110 or information read from the memory device 110.

In some examples, physical or operational aspects of the memory device 110 may degrade over time, and this degradation may be associated with a reduction of an ability to reliably store information (e.g., at a memory array 170), a reduction of an ability to reliably read information (e.g., from a memory array 170), a reduction of an ability to process information (e.g., at a local memory controller 165, at a device memory controller 155), or a reduction of an ability to communicate information (e.g., within the memory device 110, between the memory device 110 and the host device 105), among other issues. Degradation of the memory device 110 may be associated with a cumulative duration of being powered (e.g., the memory device 110 being powered by the host device 105 via a power supply interface, one or more memory dies 160 being powered by the device memory controller 155), a cumulative duration or quantity of operations over which one or more memory dies 160 or memory arrays 170 are accessed, a cumulative duration or quantity of operations over which an operating parameter (e.g., a temperature of the memory device 110 or one or more memory dies 160, a voltage of the memory device 110 or one or more memory dies 160, a moisture or humidity level of an environment while operating the memory device or one or more memory dies 160, an access rate, or other parameter of the memory device 110 or a memory die 160) satisfies a threshold, and other conditions. For example, over time, one or more components or circuitry of the memory device 110 or one or more memory dies 160 may experience dielectric breakdown, ion or other constituent material migration or transformation, thermal stress or damage, mechanical stress or damage, fatigue, or other changes that affect operational reliability of the memory device 110. Thus, according to these and other examples, a memory device 110, or memory dies 160 thereof, may be associated with a finite life expectancy for supporting access operations.

In accordance with examples as disclosed herein, the memory device 110 (e.g., the device memory controller 155, one or more memory dies 160) may include various components (e.g., logic, circuitry, sensors) configured for monitoring health and life expectancy of the memory device 110. Such monitoring may include or involve components internal to the memory device 110, such as a monitoring circuit 156 of a device memory controller 155, one or more monitoring circuits 166 of one or more local memory controllers 165, or various combinations thereof, that monitor for degradation of particular components, circuits, voltages, timings, or other characteristics of operating the memory device 110. In some examples, a monitoring circuit 156 or a monitoring circuit 166 may be configured to perform comparisons between signals or characteristics associated with performing operations at the memory device 110 (e.g., at the device memory controller 155, at a memory die 160) and one or more threshold values, which may be indicative of a life expectancy of the memory device 110, or component thereof (e.g., a life expectancy of a device memory controller 155, a life expectancy of a memory die 160).

In some examples, such components may include sensors, other circuits, or logic (among other examples) to monitor or detect voltages resulting from the memory device 110 performing an operation, or durations associated with the memory device 110 performing an operation, or other signals or operating characteristics or combinations thereof.

Such information may be compared (e.g., by the memory device 110, by the host device 105) to corresponding thresholds that are associated with a respective life expectancy level (e.g., a duration of remaining life, a percentage of remaining life). In various examples, such thresholds may be determined based on simulation, testing, or other analysis and configured at the memory device 110. The determined thresholds may be stored at or generated by components of the memory device 110 or host device 105 to support the described comparisons, which may be performed on a periodic basis (e.g., initiated by a time interval, initiated based on a quantity of operations), or initiated by a triggering condition at the memory device 110 or the host device 105 (e.g., a power cycle, a transition to an idle or power-down mode, an identified maintenance or diagnostic condition or triggering signal).

In some examples, the memory device 110 (e.g., a device memory controller 155, a local memory controller 165) may include a non-volatile storage component for storing an indication of a life expectancy of the of the memory device 110, which may refer to a storage component that is included in or separate from the memory arrays 170 of the memory device 110. Such a non-volatile storage component may be physically coupled with or otherwise attached to a same substrate as a memory array 170 or a memory die 160 (e.g., a same chip or other semiconductor substrate), or a same substrate as the memory device 110 (e.g., a same printed circuit board (PCB) or other memory module, such as a substrate of a dual in-line memory module (DIMM)). In some examples, such a non-volatile storage component may be referred to as a mode register, which may be read from or written to by a host device 105 (e.g., via channels 115) to determine parameters of the memory device 110. In some examples, such a storage component may not be accessible to a host device 105, but may be used by the memory device 110 to determine parameters of operating the memory device 110, or determine status signaling to transmit to a host device 105 (e.g., via channels 115).

In some examples, the memory device 110 (e.g., the device memory controller 155, a monitoring circuit 156, one or more local memory controllers 165, one or more monitoring circuits 166) may perform internal calculations or operations using a determined indication of life expectancy, such as adjusting a parameter of the memory device 110 (e.g., a voltage parameter, a timing parameter) for performing access operations of the memory device 110. In some examples, the memory device 110 may provide an indication of life expectancy to a host device 105, which may be associated with proactive signaling by the memory device 110, or responsive to polling (e.g., polling a mode register of the memory device 110) or other requests from the host device 105, (or both), among other examples. A system with periodic maintenance intervals may, for example, determine whether a memory device 110 can be operated until a next scheduled down time or maintenance period, or determine if more immediate action should be taken. Thus, a memory device 110, a host device 105, or both may be configured with options for dynamic (e.g., on-the-fly) adjustment to operations of the memory device 110 or host device 105 in the event of insufficient life remaining.

By supporting these and other evaluations related to life expectancy of the memory device 110, the system 100 may support various proactive measures to maintain operational reliability, including indicating that the memory device 110 should be replaced, modifying operation (e.g., timing parameters, voltage parameters, access rates) of an aging memory device 110, or selecting a different memory device 110 or memory die 160 of the same or different memory device 110 for various data storage or access operations.

Figure 2:
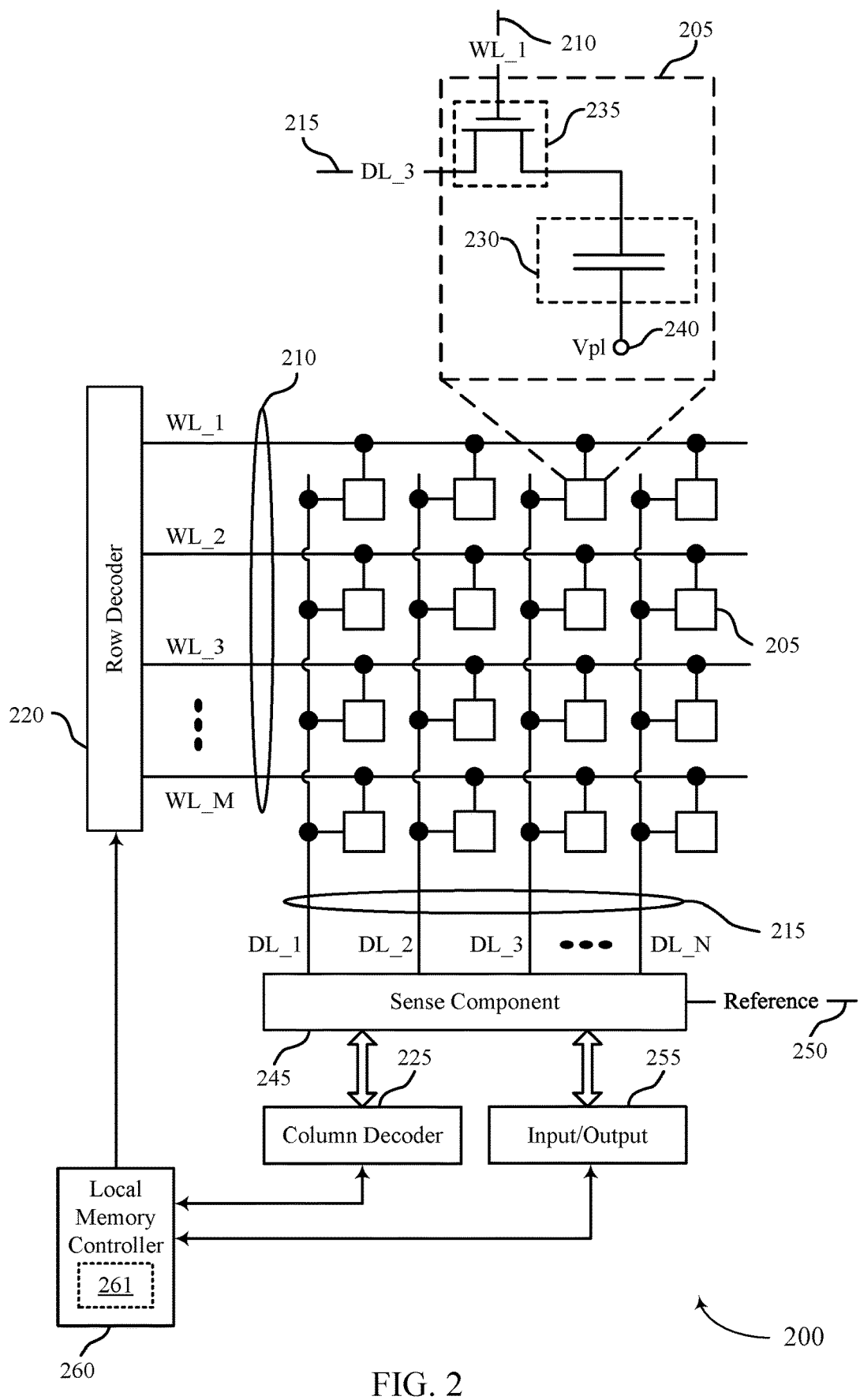
FIG. 2 illustrates an example of a memory die that supports life expectancy monitoring for memory devices in accordance with examples as disclosed herein.

FIG. 2 illustrates an example of a memory die 200 that supports life expectancy monitoring for memory devices in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

A memory cell 205 may store a charge representative of the programmable states in a capacitor. DRAM architectures may include a capacitor that includes a dielectric material to store a charge representative of the programmable state. In other memory architectures, other storage devices and components are possible. For example, nonlinear dielectric materials may be employed. The memory cell 205 may include a logic storage component, such as capacitor 230, and a switching component 235. The capacitor 230 may be an example of a dielectric capacitor or a ferroelectric capacitor. A node of the capacitor 230 may be coupled with a voltage source 240, which may be the cell plate reference voltage, such as Vpl, or may be ground, such as Vss.

The memory die 200 may include one or more access lines (e.g., one or more word lines 210 and one or more digit lines 215) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, or bit lines, or their analogues, are interchangeable without loss of understanding or operation. Memory cells 205 may be positioned at intersections of the word lines 210 and the digit lines 215.

Operations such as reading and writing may be performed on the memory cells 205 by activating or selecting access lines such as one or more of a word line 210 or a digit line 215. By biasing a word line 210 and a digit line 215 (e.g., applying a voltage to the word line 210 or the digit line 215), a single memory cell 205 may be accessed at their intersection. The intersection of a word line 210 and a digit line 215 in either a two-dimensional or three-dimensional configuration may be referred to as an address of a memory cell 205.

Accessing the memory cells 205 may be controlled through a row decoder 220 or a column decoder 225. For example, a row decoder 220 may receive a row address from the local memory controller 260 and activate a word line 210 based on the received row address. A column decoder 225 may receive a column address from the local memory controller 260 and may activate a digit line 215 based on the received column address.

Selecting or deselecting the memory cell 205 may be accomplished by activating or deactivating the switching component 235 using a word line 210. The capacitor 230 may be coupled with the digit line 215 using the switching component 235. For example, the capacitor 230 may be isolated from digit line 215 when the switching component 235 is deactivated, and the capacitor 230 may be coupled with digit line 215 when the switching component 235 is activated.

The sense component 245 may be operable to detect a state (e.g., a charge) stored on the capacitor 230 of the memory cell 205 and determine a logic state of the memory cell 205 based on the stored state. The sense component 245 may include one or more sense amplifiers to amplify or otherwise convert a signal resulting from accessing the memory cell 205. The sense component 245 may compare a signal detected from the memory cell 205 to a reference 250 (e.g., a reference voltage). The detected logic state of the memory cell 205 may be provided as an output of the sense component 245 (e.g., to an input/output 255), and may indicate the detected logic state to another component of a memory device that includes the memory die 200.

The local memory controller 260 may control the accessing of memory cells 205 through the various components (e.g., row decoder 220, column decoder 225, sense component 245). The local memory controller 260 may be an example of the local memory controller 165 described with reference to FIG. 1. In some examples, one or more of the row decoder 220, column decoder 225, and sense component 245 may be co-located with the local memory controller 260. The local memory controller 260 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 260 may generate row signals and column address signals to activate the target word line 210 and the target digit line 215. The local memory controller 260 may also generate and control various voltages or currents used during the operation of the memory die 200. In general, the amplitude, the shape, or the duration of an applied voltage or current discussed herein may be varied and may be different for the various operations discussed in operating the memory die 200.

The local memory controller 260 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 260 in response to various access commands (e.g., from a host device 105). The local memory controller 260 may be operable to perform other access operations not listed here or other operations related to the operating of the memory die 200 that are not directly related to accessing the memory cells 205.

The local memory controller 260 may be operable to perform a write operation (e.g., a programming operation) on one or more memory cells 205 of the memory die 200. During a write operation, a memory cell 205 of the memory die 200 may be programmed to store a desired logic state. The local memory controller 260 may identify a target memory cell 205 on which to perform the write operation. The local memory controller 260 may identify a target word line 210 and a target digit line 215 coupled with the target memory cell 205 (e.g., the address of the target memory cell 205). The local memory controller 260 may activate the target word line 210 and the target digit line 215 (e.g., applying a voltage to the word line 210 or digit line 215) to access the target memory cell 205. The local memory controller 260 may apply a specific signal (e.g., write pulse) to the digit line 215 during the write operation to store a specific state (e.g., charge) in the capacitor 230 of the memory cell 205. The pulse used as part of the write operation may include one or more voltage levels over a duration.

The local memory controller 260 may be operable to perform a read operation (e.g., a sense operation) on one or more memory cells 205 of the memory die 200. During a read operation, the logic state stored in a memory cell 205 of the memory die 200 may be determined. The local memory controller 260 may identify a target memory cell 205 on which to perform the read operation. The local memory controller 260 may identify a target word line 210 and a target digit line 215 coupled with the target memory cell 205 (e.g., the address of the target memory cell 205). The local memory controller 260 may activate the target word line 210 and the target digit line 215 (e.g., applying a voltage to the word line 210 or digit line 215) to access the target memory cell 205. The target memory cell 205 may transfer a signal to the sense component 245 in response to biasing the access lines. The sense component 245 may amplify the signal. The local memory controller 260 may activate the sense component 245 (e.g., latch the sense component) and thereby compare the signal received from the memory cell 205 to the reference 250. Based on that comparison, the sense component 245 may determine a logic state that is stored on the memory cell 205.

In some examples, physical or operational aspects of the memory die 200 may degrade over time, and this degradation may be associated with a reduction of an ability to reliably store information (e.g., at a memory cell 205), a reduction of an ability to reliably read information (e.g., from a memory cell 205), a reduction of an ability to process information (e.g., at a local memory controller 260), or a reduction of an ability to communicate information (e.g., within the memory die 200, via digit lines 215, via input/output component 255, between the memory die 200 and a device memory controller 155), among other issues. Degradation of the memory die 200 may be associated with a cumulative duration of the memory die 200 being powered (e.g., by a host device 105, by a device memory controller 155), a cumulative duration or quantity of access operations over which memory cells 205 are accessed or the local memory controller 260 is otherwise supporting access operations, a cumulative duration or quantity of access operations over which an operating parameter (e.g., a temperature, voltage, access rate, or other parameter of the memory die 200) satisfies a threshold, some combination thereof, or other conditions. For example, one or more components of the memory die 200 may experience dielectric breakdown, ion or other constituent material migration or transformation, thermal stress or damage, mechanical stress or damage, fatigue, or other changes that affect operational reliability of the memory die 200.

In accordance with examples as disclosed herein, the memory die 200 (e.g., the local memory controller 260) may include various components (e.g., logic, circuitry, sensors) configured for monitoring health and life expectancy of the memory die 200. Such monitoring may include or involve components internal to the memory die 200, such as a monitoring circuit 261, which may be an example of a monitoring circuit 166 described with reference to FIG. 1. A monitoring circuit 261 may be configured to monitor for degradation of particular components, circuits, voltages, timings, and other characteristics of operating the memory die 200. In some examples, a monitoring circuit 261 may be configured to monitor for changes of a voltage level of a voltage source, for changes in a voltage resulting from an access operation, or for changes in threshold voltages of one or more transistors (e.g., switching components 235, word line or digit line selection components, transistors of a row decoder 220, a column decoder 225, a sense component 245, or a local memory controller 260). Additionally or alternatively, a monitoring circuit 261 may be configured to monitor for changes in durations or time constant behavior of performing various operations (e.g., a duration or time constant between activating a switching component and developing a signal that satisfies a threshold, a duration or time constant between accessing a memory cell 205 and developing a signal that satisfies a threshold, a duration, frequency, or phase shift of a clock signal or other timing signal generated at the memory die 200). The monitoring circuit 261 may be configured to perform comparisons between monitored signals or characteristics to one or more threshold values, which may be indicative of a life expectancy of the memory die 200, or component thereof (e.g., a life expectancy of the memory cells 205, the switching components 235, a row decoder 220, a column decoder 225, a sense component 245, an input/output component 255, or a local memory controller 260)

In some examples, the memory device 110 (e.g., the local memory controller 260, the monitoring circuit 261) may perform internal calculations or operations using a determined indication of life expectancy, such as adjusting a parameter of the memory die 200 (e.g., a voltage parameter, a timing parameter) for performing access operations of the memory die 200. In some examples, the memory die 200 may provide a life expectancy indication to a device memory controller 155, or to a host device 105, which may be associated with proactive signaling, or responsive to polling or other requests.

By supporting these and other evaluations related to life expectancy of the memory die 200, a system that includes the memory die 200 may support proactive measures to maintain operational reliability, including indicating that a memory device 110 that includes the memory die 200 should be replaced, modifying operation (e.g., timing parameters, voltage parameters, access rates) of an aging memory die 200, selecting a different memory die 200 of the same or different memory device 110 for data storage or access operations, or selecting a different memory device 110 for access operations.

Figure 3:
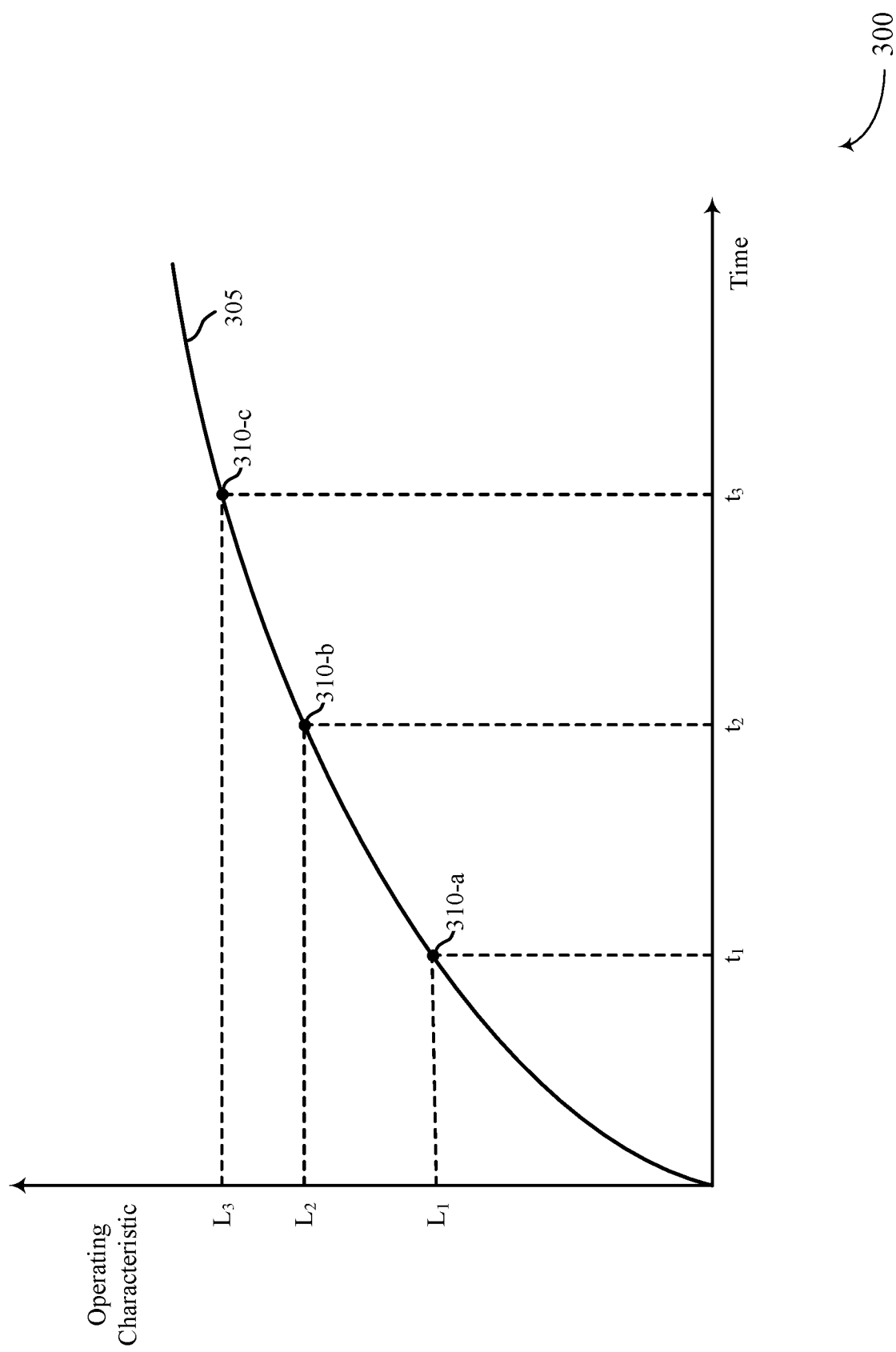
FIG. 3 illustrates an example of an operating characteristic model that supports life expectancy monitoring for memory devices in accordance with examples as disclosed herein.

FIG. 3 illustrates an example of an operating characteristic model 300 that supports life expectancy monitoring for memory devices in accordance with examples as disclosed herein. The operating characteristic model 300 includes a curve 305 of an expected change or degradation of an operating characteristic of a memory device 110 over time, which may refer to an absolute or clock time, or may refer to a normalized time or duration such as a percentage of a projected design life (e.g., where 100% corresponds to an expected or designed operating life of the memory device 110).

In some examples, there may be an expected degradation over time of various circuits of the memory device 110, or the memory device 110 as a whole. For example, over time, components or circuitry of the memory device 110 may be expected to experience dielectric breakdown, ion or other constituent material migration or transformation, thermal stress or damage, mechanical stress or damage, fatigue, or other changes that affect operational reliability of the memory device 110. In some examples, the curve 305 may illustrate an expected change of an operating condition that results from such degradation. The operating characteristic illustrated by the operating characteristic model 300 may refer to a voltage resulting from an operation of the memory device 110, a duration or other timing to perform or otherwise associated with performing an operation of the memory device 110, or some other characteristic resulting from performing an operation of the memory device 110, which may degrade or otherwise change over the operating life of the memory device 110. The curve 305 may be determined based on analytical or statistical modeling of the operation or corresponding components of the memory device 110, by testing or observing one or more operations or components of a memory device 110 or representative population of memory devices 110 (e.g., a test population), or using other techniques or combinations thereof. In some examples, to generate the curve 305, a worst-case or other usage assumption may be used to support a robust design of a memory device 110.

Degradation levels of a memory device 110 may be selected at various (e.g., key) time intervals along a curve 305, such as various determined points which may be design points 310 (e.g., design points 310-a through 310-c), which may be selected as trip points for a life expectancy monitoring or flagging system. Each of the design points 310 may be associated with a respective time and an operating characteristic level (e.g., design point 310-a being associated with a time, $t_1$, and an operating characteristic level, $L_1$, and so on). Such design points may be picked in a meaningful manner relative to how long a memory device 110 is designed to be used. For example, such design points may be associated with a life expectancy of a memory device 110, which may refer to a time duration or period over which the memory device 110 is expected to be operational, or operational within certain design parameters, such as being operational within a threshold rate of errors (e.g., a rate of correctible errors), operational within a threshold latency, operational within a threshold power consumption, operational under certain assumed or predicted operating parameters or environmental conditions, among other conditions. In some examples, a life expectancy may refer to an inferred or predicted operational end point, at which the reliability of the memory device 110 may be uncertain or unknown, or may have a relatively high probability of failure (e.g., a probability of failure that exceeds a threshold). In various examples, a life expectancy of a memory device 110 may be aligned with an expected design life of the memory device 110 itself, or may be considered in the context of an expected design life of a system that includes the memory device 110 (e.g., aligned with or designed to exceed the design life of the system that includes the memory device 110, designed with some fraction of the design life of the system that includes the memory device 110 such that some rate of replacement is expected or anticipated).

In one example, a memory device 110 may be designed with a 20 year design life, and the design points 310-a through 310-c may be associated with times of $t_1$=5 years, $t_2$=10 years, and $t_3$=15 years of operating the memory device 110-a, respectively. Although illustrated in the context of three design points 310, the techniques described herein may use any quantity of one or more design points, or associated times and operating characteristic levels, to support various granularity or resolution for evaluating life expectancy of a memory device 110, or one or more components thereof.

In one example, the curve 305 may illustrate a change or degradation over time of a voltage resulting from an operation of a memory device 110. Such an example may refer to a voltage directly resulting from an operation of a memory device 110 (e.g., an observed voltage signal, an observed threshold voltage for activating a transistor), or may refer to a difference between a voltage resulting from an operation of the memory device 110 and a baseline or initial condition. One example of such a relationship is illustrated by Table 1, associating each of three design points over a 20 year expected design life with an operating time, a remaining life, an expected degradation (e.g., an expected voltage level, an expected operating condition level), and a concern level.

TABLE 1

Example of expected voltage degradation over time

| Operating Time | Remaining Life | Expected Degradation | Concern Level |
| --- | --- | --- | --- |
| 5 years | 75% | 25 mV | Low Risk |
| 10 years | 50% | 40 mV | Medium Risk |
| 15 years | 25% | 50 mV | High Risk |

Additionally or alternatively, a similar relationship may be established for one or more other monitored operating characteristics resulting from or otherwise associated with performing an operation at a memory device 110, such as a monitored charge level, a monitored current level, a monitored duration, a monitored frequency, or other characteristics. Although the curve 305 illustrates a change in operating characteristic that is positively correlated (e.g., increasing) over time, the described techniques may be applicable to various change or degradation relationships that are positively or negatively correlated, including linear, exponential, polynomial, logarithmic, or discontinuous (e.g., stepped) relationships over time.

In some examples, the times or operating characteristic levels of a model such as the operating characteristic model 300 may correspond to threshold values for which a comparison may be made when evaluating a life expectancy or remaining life of a memory device 110. In other words, the times and operating condition levels of the curve 305 may provide a proxy or a prediction for degradation or life expectancy of memory devices 110, and used by comparison logic or circuitry to evaluate various life expectancy characteristics of a particular memory device 110 that is being operated.

Figure 4:
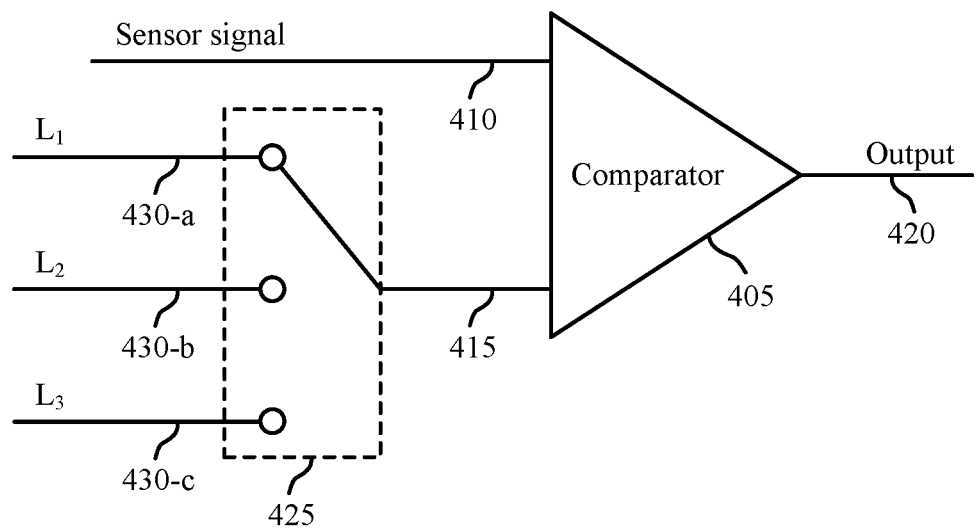
FIG. 4 illustrates an example of comparison circuitry that supports life expectancy monitoring for memory devices in accordance with examples as disclosed herein.

FIG. 4 illustrates an example of comparison circuitry 400 that supports life expectancy monitoring for memory devices in accordance with examples as disclosed herein. The comparison circuitry 400 may be an example of flagging circuitry for evaluating degradation or life expectancy of a memory device 110 based on a signal resulting from operating the memory device 110. In some examples, the comparison circuitry 400 may be a component of a memory device 110 (e.g., of monitoring circuit 156, of monitoring circuit 166), such as when the memory device 110 is configured to evaluate its own life expectancy based on a signal resulting from operating the memory device 110. In some examples, the comparison circuitry 400 may be a component of a host device 105, such as when the host device 105 is configured to evaluate life expectancy of a memory device 110 based on a received signal resulting from operating the memory device 110.

The comparison circuitry 400 includes a comparator 405, which may be configured to provide an output (e.g., at an output line 420) based on a comparison between a monitored signal (e.g., via a signal line 410) and a threshold (e.g., via a threshold line 415). In some examples, the comparator 405 may be configured to provide a logical output, such as a logic 0 when a signal of the signal line 410 is less than a signal of the threshold line 415, or a logic 1 when a signal of the signal line 410 is greater than a signal of the threshold line 415. In some examples, the comparator 405 may be configured to provide a value equal to or otherwise associated with a difference between a signal of the signal line 410 and a signal of the threshold line 415 (e.g., as a positive or negative value, as a digital or analog output).

The signal line 410 may be coupled with a sensor configured to sense or monitor an operating characteristic of the memory device 110, or may be directly coupled or connected with a component or circuit of the memory device 110 that otherwise provides or indicates such an operating characteristic level or value. In some examples, the signal line 410 may be associated with a sensor monitoring a timing or duration, a temperature, or a voltage of the memory device 110, and the comparator 405 may be configured to evaluate such characteristics as timing violations, voltage violations (e.g., a voltage drift), or some other characteristic (e.g., an absolute characteristic) that can be measured directly.

In some examples, a degradation condition of a memory device 110 may not be able to be measured directly (e.g., where absolute sensors or direct coupling with a signal source may not be able to be physically placed in a certain location, where too many replicas of a circuit exist to monitor each circuit), or may not be detectable until a catastrophic failure. In these and other examples, the signal line 410 may be coupled with a proxy circuit or other proxy sensor component that is activated or evaluated based on an operation at the memory device 110. In some examples, such a proxy circuit or component may be activated based at least in part on other operations of the memory device 110, so that the proxy circuit can accumulate stress or degradation in a manner that is indicative of stress or degradation on another component of the memory device 110.

A signal on the signal line 410 may be a result of performing an operation at a memory device 110, and may be compared with various thresholds (e.g., trip points) provided by the threshold line 415. In the example of comparison circuitry 400, the threshold line 415 may be coupled with one of a set of threshold sources 430 via a selection component 425, where each threshold source 430 is associated with a respective threshold value (e.g., threshold source 430-a associated with an operating characteristic level $L_1$, and so on). In other examples, a comparator 405 may be provided for each of a set of threshold sources 430, which may be coupled with a common signal line 410 (e.g., in a hard-wired configuration without a selection component 425). In various examples, a threshold source 430 may provide an analog threshold value (e.g., as a voltage provided by a voltage source) or a digital threshold value (e.g., as a bit sequence associated with a monitoring configuration, as a duration value) for analog or digital comparisons, respectively. Although illustrated with three threshold sources 430, different quantities of threshold sources 430 may be configured in a comparison circuit to support life expectancy evaluations at finer or coarser granularity.

In an illustrative example, $L_1$ may be associated with 75% life expectancy remaining, $L_2$ may be associated with 50% life expectancy remaining, and $L_3$ may be associated with 25% life expectancy remaining. If the comparator 405 determines that the sensor signal (e.g., a detected voltage, a detected duration) does not satisfy any of the threshold values, the output may indicate that the memory device 110 has at least 75% life expectancy remaining. If the comparator 405 determines that the sensor signal satisfies the threshold value $L_1$ (e.g., and does not satisfy the threshold levels of $L_2$ or $L_3$), the output may indicate that the memory device 110 has between 50% and 75% life expectancy remaining. If the comparator 405 determines that the sensor signal satisfies the threshold values $L_1$ and $L_2$ (e.g., and does not satisfy the threshold value $L_3$), the output may indicate that the memory device 110 has between 25% and 50% life expectancy remaining. If the comparator 405 determines that the sensor signal satisfies the threshold values $L_1$, $L_2$, and $L_3$, the output may indicate that the memory device 110 has less than 25% life expectancy remaining.

In another illustrative example, in the context of Table 1, the signal line 410 may monitor a voltage resulting from an operation of a memory device 110. If the signal line 410 indicates a voltage of 50 millivolts (mV), for example, the comparator 405 may infer or indicate a remaining life of 25% or 5 years. In some examples, a threshold value may be selected based on how long a memory device 110 has been operated to support an evaluation of whether the memory device 110 is degrading more quickly or more slowly than expected. For example, at 5 years of operation, the selection component 425 may be configured to select a corresponding threshold source 430 (e.g., selecting a voltage source associated with a threshold value of 25 mV). If the voltage is below the expected degradation (e.g., below 25 mV) the comparator 405 may infer or indicate that the memory device 110 is degrading more slowly than expected, such that degradation mitigation may not be necessary (e.g., because the memory device 110 is operating as expected, because open-loop mitigation may already be applied at the memory device 110). If the voltage is above the expected degradation (e.g., above 25 mV), the comparator 405 may infer or indicate an accelerated degradation, which may be used by the memory device 110 or host device 105 to perform a mitigation.

In some examples, the output line 420 may be configured to output separate, respective signals or bits corresponding to each of the threshold sources 430 (e.g., a first comparator flag or bit associated with the threshold source 430-a or threshold value $L_1$, and so on). In some examples, the comparator 405 may be configured with logic or circuitry that aggregates comparisons between the signal line 410 and each of the threshold sources 430, such that the output line 420 provides a single indication of life expectancy that is based at least in part on the comparisons with each of the threshold values or threshold sources 430.

In some examples, a set of comparators 405 may each be associated with a different sensor or circuit portion of a memory device 110, and a set of output lines 420 may be fed into a common OR gate. In such a manner, any one or more of the comparators 405 giving a particular reading may indicate that the memory device 110 is in a conservative (e.g., worst case) category for life expectancy. For example, if one or more sensor signals indicate that the threshold $L_1$ is satisfied, the associated flagging circuitry may indicate that the memory device 110 as a whole has less than 75% life expectancy remaining. If one or more sensor signals indicate that the threshold $L_3$ is satisfied, the associated flagging circuitry may indicate that the memory device 110 as a whole has less than 25% life expectancy remaining.

The output of the comparator 405 may be provided to various components of a memory device 110 or a host device 105. In some examples, an output may be provided to a storage component of a memory device 110 for storing a life expectancy indication (e.g., in a mode register, in a volatile or non-volatile storage component). In some examples, an output may be used by a memory device 110 to perform or modify operations of the monitored memory device 110, or may be used by a host device 105 to perform or modify operations of the monitored memory device 110 or a different memory device 110.

Figure 5:
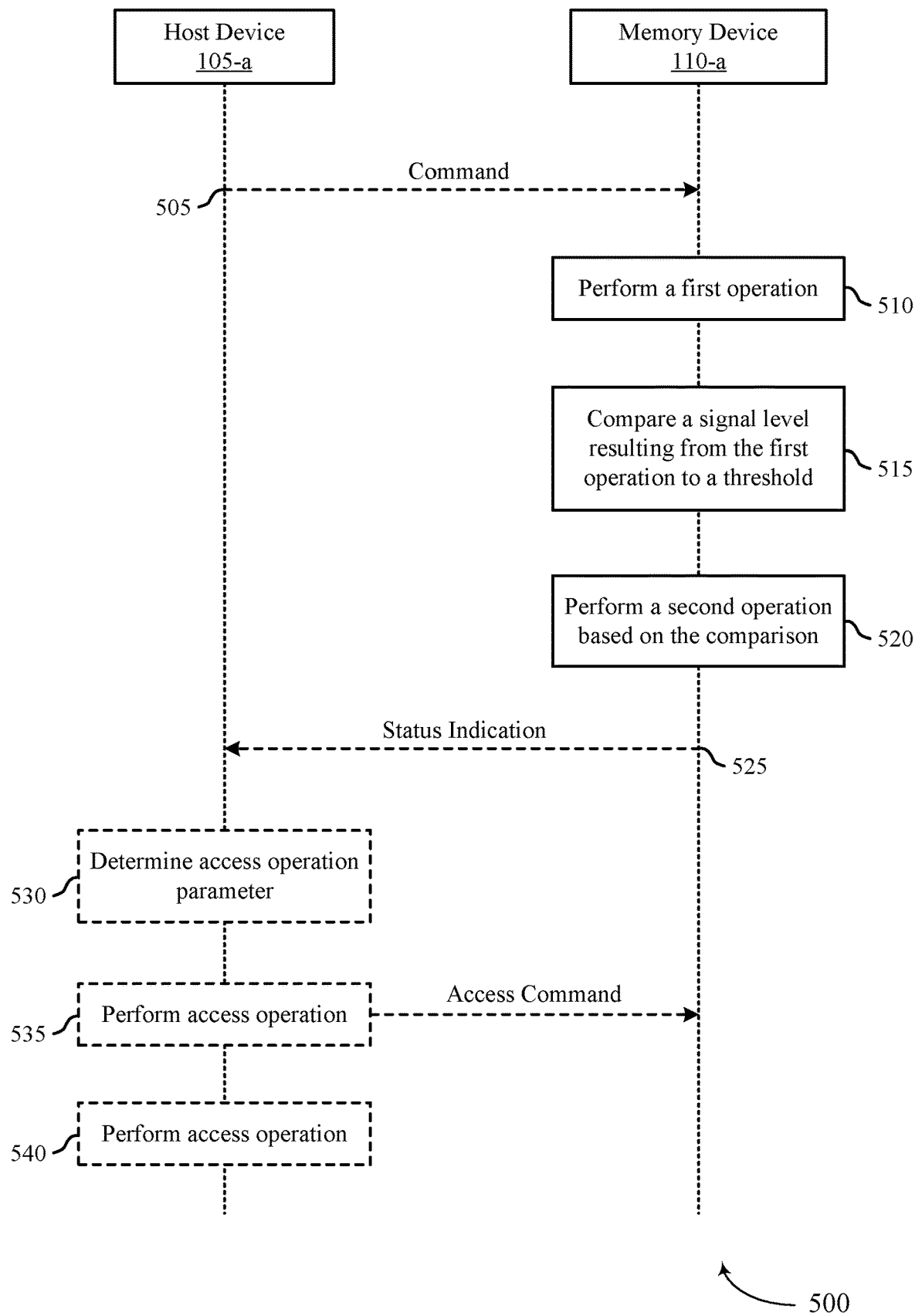
FIG. 5 illustrates an example of a system and associated operations and signaling that support life expectancy monitoring for memory devices in accordance with examples as disclosed herein.

FIG. 5 illustrates an example of a system 500 and associated operations and signaling that support life expectancy monitoring for memory devices in accordance with examples as disclosed herein. The system 500 includes a host device 105-a and a memory device 110-a, which may be examples of the respective components described with reference to FIG. 1. The host device 105-a and the memory device 110-a may be coupled via a physical or logical interface, such as channels 115, that support signaling between the respective devices. The memory device 110-a may illustrate an example of an apparatus that includes an array of memory cells 205 couplable to an interface with a processor or SoC (e.g., of the host device 105-a) and configured to operate in response to commands from the processor or the SoC. The memory device 110-a may include logic or circuitry (e.g., a monitoring circuit 156, one or more monitoring circuits 166, one or more monitoring circuits 261, or various combinations thereof) that may be attached to a same substrate, for example, as the array of memory cells 205, which may be configured to support various operations described herein. In some examples, the array of memory cells 205 of the memory device 110-a may be volatile memory cells, and the memory device 110-a may further include a non-volatile storage component (e.g., one or more non-volatile memory cells, latches, fuses or antifuses) configured to store an indication of a life expectancy of the memory device 110-a.

At 510, the memory device 110-a may perform a first operation. In some examples, the first operation may be based at least in part on a received command or other received signal. For example, at 505, the host device 105-a may transmit a command, such as an access command (e.g., a refresh command, an activate command, a read command, a write command, or any combination thereof), a diagnostic command, or some other command that triggers or initiates the first operation of 510 (e.g., a power-up command or sequence). The memory device 110-a may receive the command of 505 and, at 510, the memory device 110-a may perform the first operation based at least in part on receiving the access command of 505. In other examples, the first operation of 510 may be performed by the memory device 110-a based on some other initiating condition at the memory device 110-a, in which case the command of 505 may be omitted.

At 515, the memory device 110-a may compare a signal level resulting from the first operation to a threshold value, where the threshold value may be indicative of a life expectancy of the memory device 110-a. In some examples, the signal level may be a voltage level resulting from the first operation of 505, and the comparison of 515 may include a comparison to a voltage threshold that is indicative of a life expectancy of the memory device 110-a. In some examples, the signal level may be a duration associated with performing the first operation of 505, and the comparison may include a comparison to a duration threshold that is indicative of the life expectancy of the memory device. In some examples, the comparison of 515 may be associated with (e.g., followed by, support) determining an estimated percentage of remaining life of the memory device 110-a, or an estimated duration of remaining life of the memory device 110-a, or that an estimate of remaining life of the memory device 110-a satisfies a threshold of remaining life. In some examples, the threshold value may be associated with an age or operating history of the memory device, and the memory device 110-a may determine that a degradation of the memory device 110-a satisfies a threshold degradation (e.g., indicating degradation that is faster or slower than expected).

In some examples, the first operation of 510, the comparison of 515, or both may be performed or initiated on a periodic basis (e.g., according to a duration of operation, according to a quantity of access operations, according to a monitoring interval). In some examples, the first operation of 510, the comparison of 515, or both may be triggered by a condition at the host device 105-a or the memory device 110-a (e.g., triggered at a power cycle, triggered at a deep power-down operation, triggered upon entering or exiting a power mode, triggered based on an access pattern, triggered upon a detection of a row hammer condition). In some examples, evaluation intervals or initiation conditions may be changed over time, such as shortening a testing interval based on a duration of operation, or a detected remaining life expectancy (e.g., based on flag bits). For example, if the comparison of 515 indicates accelerated degradation, a monitoring or evaluation interval may be shortened to support more frequent evaluation of the memory device 110-a.

At 520, the memory device 110-a may perform a second operation based at least in part on the comparison of 515. In some examples, the memory device 110-a may adjust a voltage parameter of the memory device 110-a (e.g., a voltage source level, a read or write bias, a reference voltage level), a timing parameter of the memory device 110-a (e.g., a duration or rate of performing access operations or portion thereof, a refresh interval, an idle duration), or both based at least in part on the comparison of 515. In some examples, the comparison of 515 may indicate a circuit slow-down, and the memory device 110-a may determine to remedy the slow-down by increasing a voltage for performing subsequent access operations (e.g., adding 100 mV to a voltage supply circuit). In another example, degradation may be related to duty cycle, such as an excessive timing skew. In such examples, the memory device 110-a may be configured to enable or disable delay components to re-center timing. In some examples, the memory device 110-a may be configured to enable a redundant circuit based at least in part on the comparison of 515 (e.g., disabling a first circuit component or memory array 170 and enabling a second circuit component or memory array 170). In some examples, at 520, the memory device 110-a may store (e.g., in a non-volatile storage component) an indication that a remaining life of the memory device 110-a satisfies a threshold of remaining life. In some examples, if a dynamic change is made at the memory device 110-a (e.g., to mitigate an effect of degradation), the memory device 110-a may be configured to adapt a sensor or corresponding signal on a signal line 410, or adapt a threshold source 430 or corresponding signal on a threshold line 415 (e.g., enabling a different threshold source 430), so that a comparator 405 does not continue to flag a need for further mitigation.

Although illustrated in the context of a response to a single operation (e.g., the first operation of 510), in some examples, the described techniques may be performed in response to more than one operation or associated evaluation. For example, the memory device 110-*a* may perform a third operation, and compare a second signal level resulting from the third operation to a second threshold value. In such examples, the operation of 520 may be performed based at least in part on comparing the second signal level to the second threshold value (e.g., as well as the comparison of 515).

In some examples, at 525 (e.g., and as part of, or otherwise based at least in part on performing the second operation of 520), the memory device 110-*a* may signal a status of the memory device 110-*a* to the host device 105-*a*. The signaling of 525 may be based at least in part on the comparison of 515, and may include the memory device 110-*a* signaling an indication of a life expectancy of the memory device 110-*a*. In various examples, the signaling of 525 may be a proactive signaling by the memory device 110-*a*, or may be in response to the memory device 110-*a* receiving a polling request from the host device 105-*a* (e.g., polling a mode register of the memory device 110-*a*). The signaling of 525 may indicate an estimated percentage of remaining life of the memory device 110-*a*, or an estimated duration of remaining life of the memory device 110-*a*, or an indication that an estimate of remaining life of the memory device 110-*a* satisfies a threshold of remaining life. In some examples, the signaling of 525 may include sensor signal levels associated with performing the first operation of 510, supporting the host device 105-*a* performing various calculations or evaluations based on such signal levels (e.g., when the host device 105-*a* includes one or more comparators 405 or other evaluation logic or circuitry).

In some examples, at 530, the host device 105-*a* may determine a parameter for performing one or more access operations (e.g., based on the status indication of 525, based on the indication of the life expectancy of the memory device 110-*a*). In some examples, the determination of 530 may be related to access operations on the memory device 110-*a* (e.g., determining to change a voltage or timing parameter for accessing the memory device 110-*a*). In some examples, the determination of 530 may include determining which of a set of memory devices 110 or memory arrays 170 to use for an access operation, such as determining to refrain from performing an access operation on the memory device 110-*a*, or determining to perform an access operation on a different memory device 110 (not shown). In some examples, the determination of 530 may include determining an estimated life expectancy parameter associated with an age or operating history of the memory device 110-*a*, and determining the access operation parameter based at least in part on comparing an indication of the status signaling of 525 to the estimated life expectancy parameter (e.g., based at least in part on a determination of whether the memory device 110-*a* is degrading more quickly or more slowly than expected).

In some examples, if the host device 105-*a* is configured to perform a dynamic adjustment, the status indication of 525 may be interpreted by the host device 105-*a* to perform certain responsive actions or determinations. For example, one bit of a mode register may be interpreted by the host device 105-*a* as an indication to throttle (e.g., slow down, reduce) a clock rate, such as lengthening a duration or period of a clock signal. Another bit of a mode register may be interpreted by the host device 105-*a* as an indication to use a power-down mode more often, which may be at the expense of performance or latency. Another bit of a mode register may be interpreted by the host device 105-*a* as an indication to change an address scheme (e.g., if possible), such as accessing a different memory array 170, or accessing a different pattern of memory cells 205. Thus, according to these and other examples, the memory device 110-*a* may use a mode register to support signaling to the host device 105-*a* what action to perform for dynamic adjustment.

In some examples, at 535, the host device 105-*a* may perform an access operation based at least in part on determining the parameter at 530, which may include transmitting an access command to the memory device 110-*a*, or another memory device 110 (not shown). In some examples, the second operation of 520 may be performed by the memory device 110-*a* based at least in part on such an access command. The access command of 535 may include parameters determined at 530, or may otherwise be determined according to such parameters.

In some examples, at 540, the host device 105-*a* may transmit an indication of a status of the memory device 110-*a* to a device different than the memory device (e.g., based at least in part on the status indication of 525). In some examples, the indication of 540 may be transmitted to a device or component of the system 500 that can indicate (e.g., to a user) that the memory device 110-*a* should be repaired or replaced, or that the memory device 110-*a* has reached a threshold level (e.g., an accelerated level) of degradation or impaired operation, among other indications. Such indications to the user may include a check engine light or other dash indication of a vehicle that includes the system 500, or an indicator displayed by a computing system that includes the system 500, among other indications.

Figure 6:
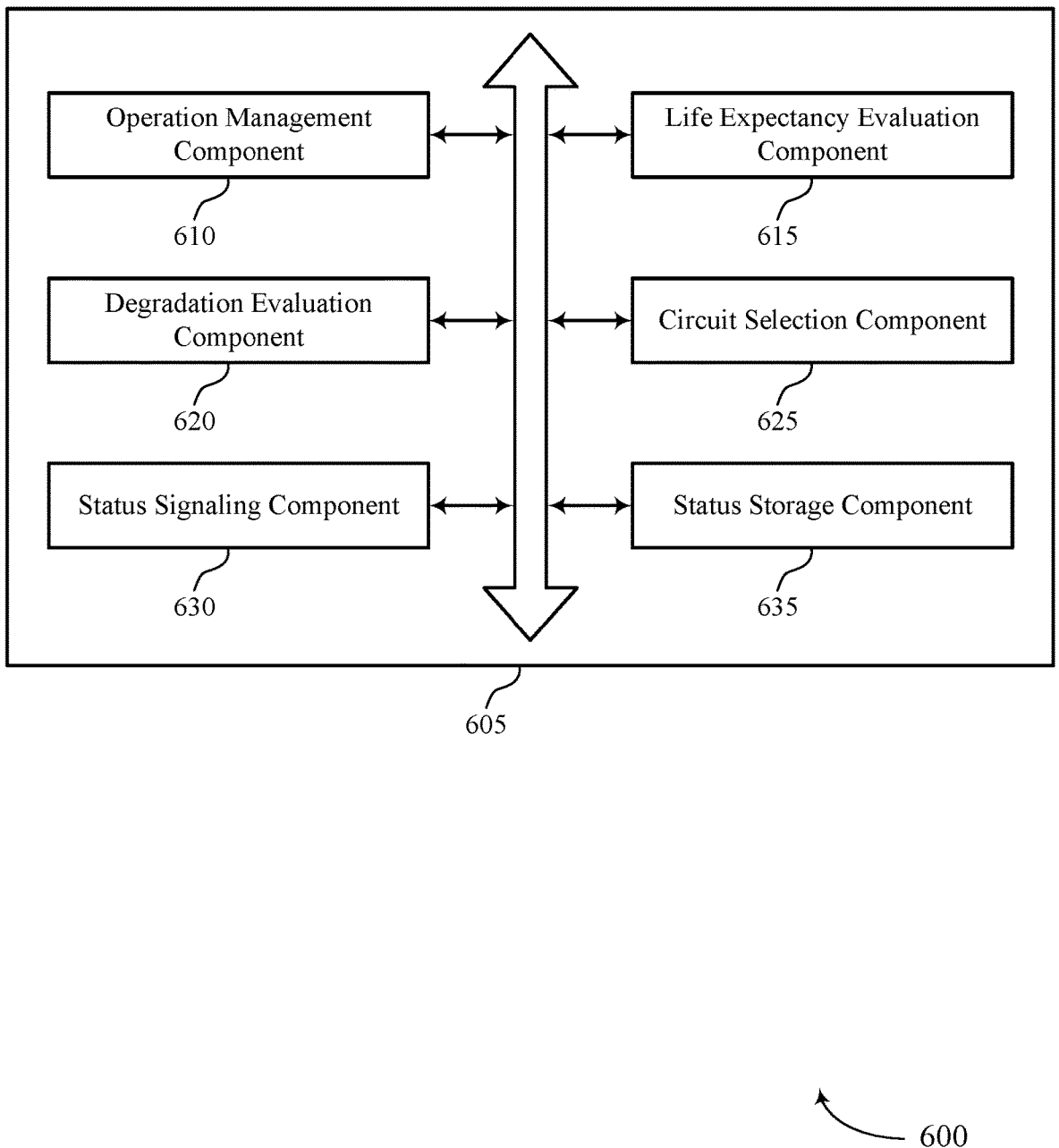
FIG. 6 shows a block diagram of a memory device that supports life expectancy monitoring for memory devices in accordance with aspects of the present disclosure.

FIG. 6 shows a block diagram 600 of a memory device 605 that supports life expectancy monitoring for memory devices in accordance with examples as disclosed herein. The memory device 605 may be an example of aspects of a memory device as described with reference to FIGS. 1 through 5. The memory device 605 may include an operation management component 610, a life expectancy evaluation component 615, a degradation evaluation component 620, a circuit selection component 625, a status signaling component 630, and a status storage component 635. Each of these modules may communicate, directly or indirectly, with one another (e.g., via one or more buses).

The operation management component 610 may perform a first operation (e.g., an access operation), which may be performed in response to at least one of a refresh command, an activate command, a read command, or a write command, or any combination thereof. In some examples, a first operation may be performed in response to a power-up sequence. In some examples, the operation management component 610 may perform a second operation based on a comparison (e.g., by the life expectancy evaluation component 615) of a signal level resulting from the first operation to a threshold value that is indicative of the life expectancy of the memory device 605. In some examples, to perform the second operation, the operation management component 610 may adjust a voltage parameter of the memory device 605, a timing parameter of the memory device 605, or both (e.g., based on a comparison of the signal level resulting from the first operation to the threshold value).

In some examples, the operation management component 610 may perform a third operation, and the operation management component 610 may perform the second operation based on a comparison (e.g., by the life expectancy evaluation component 615) of a second signal level resulting from the third operation to a second threshold value that is indicative of the life expectancy of the memory device 605.

The life expectancy evaluation component 615 may compare a signal level resulting from a first operation to a threshold value that is indicative of a life expectancy of the memory device 605. In some examples, the life expectancy evaluation component 615 may compare a second signal level resulting from a third operation to a second threshold value that is indicative of the life expectancy of the memory device 605.

In some examples, a signal level resulting from an operation may include a voltage resulting from the operation and, to compare the signal level to the threshold value, the life expectancy evaluation component 615 may compare the voltage resulting from the operation to a voltage threshold that is indicative of the life expectancy of the memory device 605.

In some examples, a signal level resulting from an operation may include a duration associated with performing the operation and, to compare the signal level to the threshold value, the life expectancy evaluation component 615 may compare the duration associated with performing the operation to a duration threshold that is indicative of the life expectancy of the memory device 605.

In some examples, the life expectancy evaluation component 615 may determine, based on comparing a signal level resulting from an operation to a threshold value, an estimated percentage of remaining life of the memory device 605, or an estimated duration of remaining life of the memory device 605, or that an estimate of remaining life of the memory device 605 satisfies a threshold of remaining life.

In some examples, a threshold value that is indicative of a life expectancy of the memory device 605 may be associated with an age or an operating history of the memory device 605, and the degradation evaluation component 620 may determine that a degradation of the memory device 605 satisfies a threshold degradation based on comparing a signal level resulting from an operation to a threshold value.

In some examples, to support the operation management component 610 performing a second operation, the circuit selection component 625 may disable a first circuit component of the memory device 605 based on comparing the signal level resulting from a first operation to a threshold value. In some examples, to support the operation management component 610 performing a second operation, the circuit selection component 625 may enable a second circuit component of the memory device 605 (e.g., a redundant circuit component) based on comparing a signal level resulting from a first operation to a threshold value.

The status signaling component 630 may signal (e.g., to a host device coupled with the memory device 605) a status of the memory device 605 based on comparing a signal level resulting from a first operation to a threshold value. In some examples, the status signaling component 630 may signal an indication that a remaining life of the memory device 605 satisfies a threshold of remaining life.

The status storage component 635 may be an example of a non-volatile storage component of the memory device 605 configured for storing an indication that a remaining life of the memory device 605 satisfies a threshold of remaining life. In some examples, the status signaling component 630 may receive (e.g., from a host device coupled with the memory device 605) a request for status information of the memory device 605, and the status signaling component 630 may transmit, based on receiving the request for status information, the indication stored in the status storage component 635 that the remaining life of the memory device 605 satisfies the threshold of remaining life.

Figure 7:
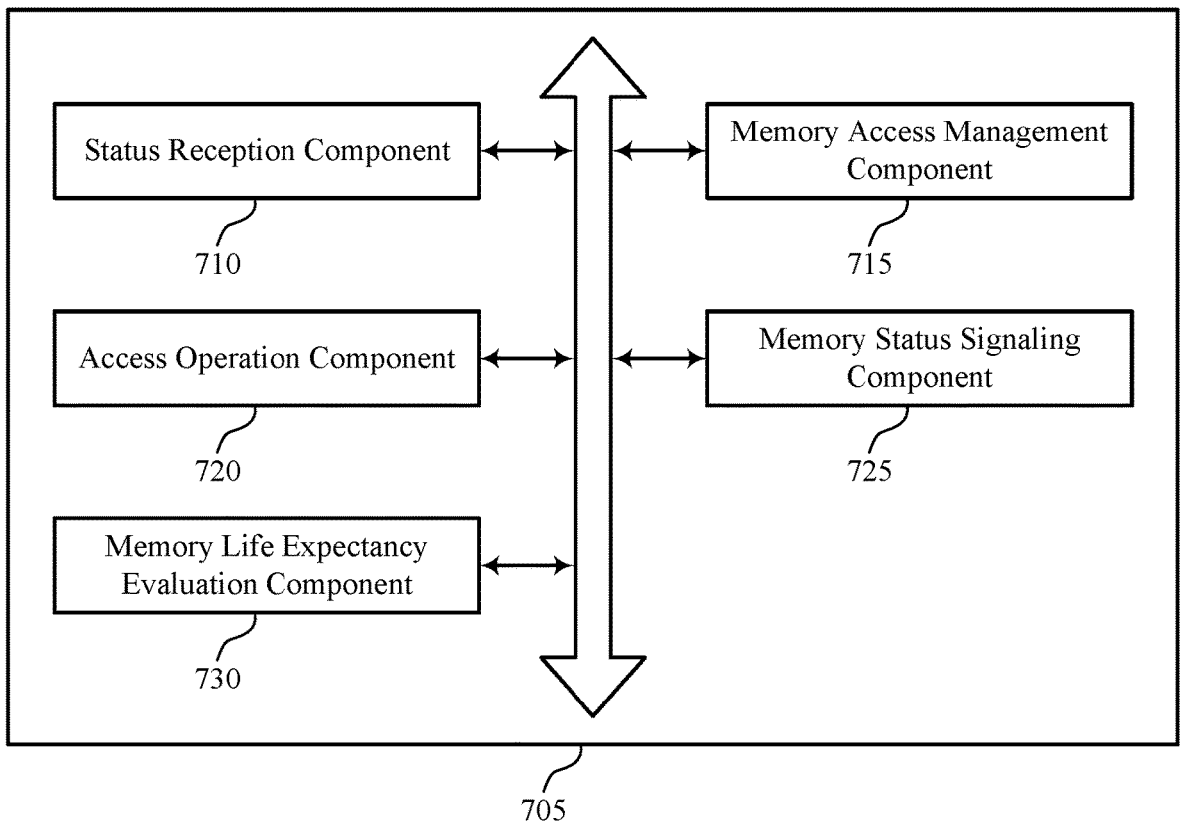
FIG. 7 shows a block diagram of a host device that supports life expectancy monitoring for memory devices in accordance with aspects of the present disclosure.

FIG. 7 shows a block diagram 700 of a host device 705 that supports life expectancy monitoring for memory devices in accordance with examples as disclosed herein. The host device 705 may be an example of aspects of a host device as described with reference to FIGS. 1 through 5. The host device 705 may include a status reception component 710, a memory access management component 715, an access operation component 720, a memory status signaling component 725, and a memory life expectancy evaluation component 730. Each of these modules may communicate, directly or indirectly, with one another (e.g., via one or more buses).

The status reception component 710 may receive (e.g., from a memory device coupled with the host device 705), an indication of a life expectancy of a memory device. In some examples, to receive the indication of the life expectancy, the status reception component 710 may receive an indication of an estimated percentage of remaining life of the memory device, or an indication of an estimated duration of remaining life of the memory device, or an indication that an estimate of remaining life of the memory device satisfies a threshold of remaining life. In some examples, to receive the indication of the life expectancy, the status reception component 710 may poll a non-volatile storage component of the memory device.

The memory access management component 715 may determine a parameter for performing one or more access operations (e.g., on the memory device, on a different memory device) based on receiving the indication of the life expectancy of the memory device.

In some examples, to determine the parameter for performing the one or more access operations, the memory access management component 715 may determine to change a parameter (e.g., a voltage, a duration, an access rate) for operating the memory device based on receiving the indication of the life expectancy of the memory device.

In some examples, to determine the parameter for performing the one or more access operations, the memory access management component 715 may determine to refrain from performing an operation on the memory device based on receiving the indication of the life expectancy of the memory device.

In some examples, to determine the parameter for performing the one or more access operations, the memory access management component 715 may determine to perform an access operation using a second memory device (e.g., a different memory device) based on receiving the indication of the life expectancy of the memory device.

In some examples, the memory life expectancy evaluation component 730 may determine an estimated life expectancy parameter associated with an age or operating history of the memory device, and the memory access management component 715 may determine a parameter for performing the one or more access operations based on comparing the indication of the life expectancy of the memory device to the estimated life expectancy parameter.

The access operation component 720 may perform an access operation (e.g., on the memory device, on a different memory device) based on determining the parameter for performing the one or more access operations.

The memory status signaling component 725 may transmit an indication of a status of the memory device to a device different than the memory device based on receiving the indication of the life expectancy of the memory device. In some examples, the memory access management component 715 may determine that a degradation of the memory device satisfies a threshold degradation based on comparing an indication of the life expectancy to a threshold associated with an age or operating history of the memory device, and the memory status signaling component 725 may transmit the indication of the status of the memory device based on determining that the degradation of the memory device satisfies the threshold degradation.

Figure 8:
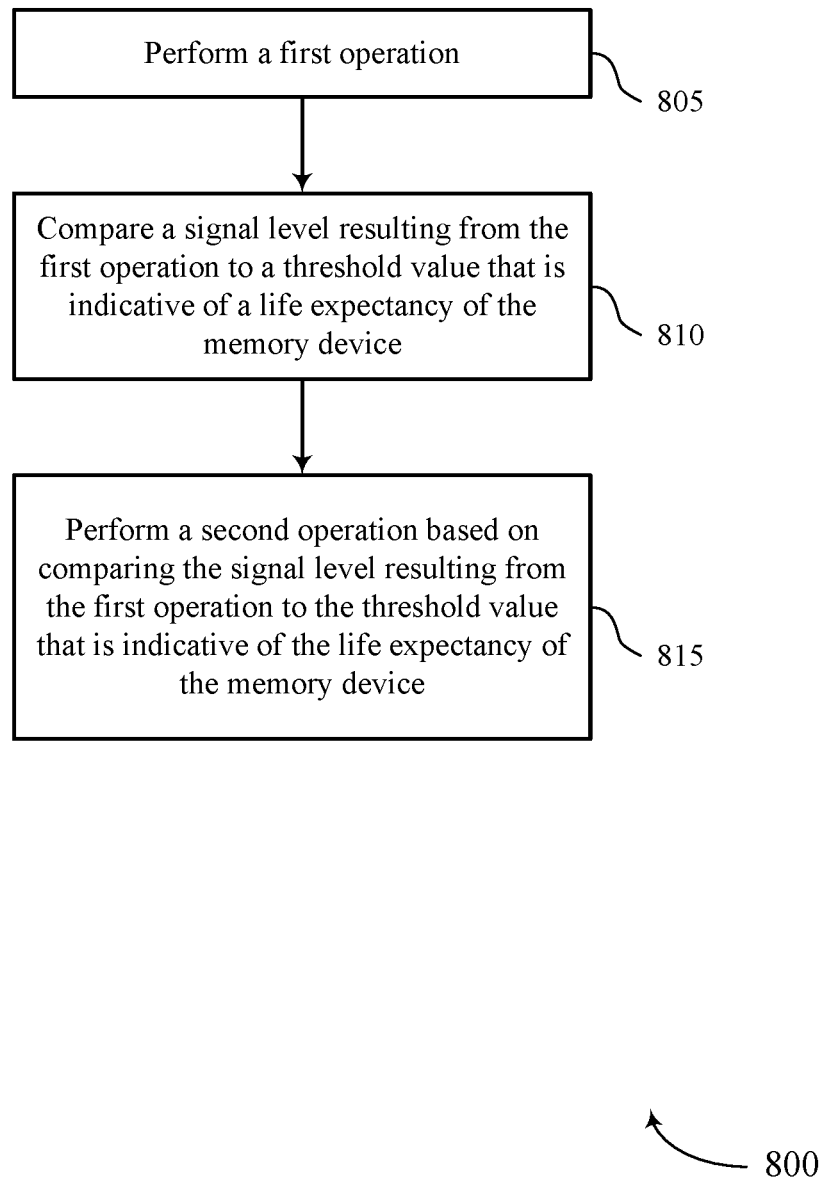
FIGS. 8 and 9 show flowcharts illustrating a method or methods that support life expectancy monitoring for memory devices in accordance with examples as disclosed herein.

FIG. 8 shows a flowchart illustrating a method or methods 800 that supports life expectancy monitoring for memory devices in accordance with aspects of the present disclosure. The operations of method 800 may be implemented by a memory device or its components as described herein. For example, the operations of method 800 may be performed by a memory device as described with reference to FIG. 6. In some examples, a memory device may execute a set of instructions to control the functional elements of the memory device to perform the described functions. Additionally or alternatively, a memory device may perform aspects of the described functions using special-purpose hardware.

At 805, the memory device may perform a first operation which, in some examples, may be performed in response to at least one of a refresh command, an activate command, a read command, or a write command, or any combination thereof (e.g., from a host device). In some examples, a first operation may be performed in response to a power-up sequence. The operations of 805 may be performed according to the methods described herein. In some examples, aspects of the operations of 805 may be performed by an operation management component as described with reference to FIG. 6.

At 810, the memory device may compare a signal level resulting from the first operation to a threshold value that is indicative of a life expectancy of the memory device. The operations of 810 may be performed according to the methods described herein. In some examples, aspects of the operations of 810 may be performed by a life expectancy evaluation component as described with reference to FIG. 6.

At 815, the memory device may perform a second operation based on comparing the signal level resulting from the first operation to the threshold value that is indicative of the life expectancy of the memory device. The operations of 815 may be performed according to the methods described herein. In some examples, aspects of the operations of 815 may be performed by an operation management component as described with reference to FIG. 6.

In some examples, an apparatus (e.g., a memory device apparatus) as described herein may perform a method or methods, such as the method 800. The apparatus may include features, circuitry, logic, means, or instructions (e.g., a non-transitory computer-readable medium storing instructions executable by a processor) for performing a first operation (e.g., in response to at least one of a refresh command, an activate command, a read command, a write command, or a power-up sequence, or any combination thereof), comparing a signal level resulting from the first operation to a threshold value that is indicative of a life expectancy of the apparatus, and performing a second operation based on comparing the signal level resulting from the first operation to the threshold value that is indicative of the life expectancy of the apparatus.

In some examples of the method 800 and the apparatus described herein, the signal level resulting from the first operation may include a voltage resulting from the first operation, and comparing the signal level to the threshold value may include operations, features, circuitry, logic, means, or instructions for comparing the voltage resulting from the first operation to a voltage threshold that is indicative of the life expectancy of the memory device.

In some examples of the method 800 and the apparatus described herein, the signal level resulting from the first operation may include a duration associated with performing the first operation, and comparing the signal level to the threshold value may include operations, features, circuitry, logic, means, or instructions for comparing the duration associated with performing the first operation to a duration threshold that is indicative of the life expectancy of the memory device.

Some examples of the method 800 and the apparatus described herein may further include operations, features, circuitry, logic, means, or instructions for determining, based on comparing the signal level resulting from the first operation to the threshold value, an estimated percentage of remaining life of the memory device, or an estimated duration of remaining life of the memory device, or that an estimate of remaining life of the memory device satisfies a threshold of remaining life.

In some examples of the method 800 and the apparatus described herein, the threshold value may be associated with an age or an operating history of the memory device, and the method 800 or the apparatus may further include operations, features, circuitry, logic, means, or instructions for determining that a degradation of the memory device satisfies a threshold degradation based on comparing the signal level resulting from the first operation to the threshold value.

In some examples of the method 800 and the apparatus described herein, performing the second operation at the memory device may include operations, features, circuitry, logic, means, or instructions for adjusting a voltage parameter of the memory device, a timing parameter of the memory device, or both, based on comparing the signal level resulting from the first operation to the threshold value.

In some examples of the method 800 and the apparatus described herein, performing the second operation at the memory device may include operations, features, circuitry, logic, means, or instructions for disabling a first circuit component of the memory device based on comparing the signal level resulting from the first operation to the threshold value, and enabling a second circuit component of the memory device based on comparing the signal level resulting from the first operation to the threshold value.

In some examples of the method 800 and the apparatus described herein, performing the second operation at the memory device may include operations, features, circuitry, logic, means, or instructions for signaling (e.g., to a host device coupled with the memory device) a status of the memory device based on comparing the signal level resulting from the first operation to the threshold value.

In some examples of the method 800 and the apparatus described herein, signaling the status of the memory device may include operations, features, circuitry, logic, means, or instructions for signaling an indication that a remaining life of the memory device satisfies a threshold of remaining life.

In some examples of the method 800 and the apparatus described herein, performing the second operation at the memory device may include operations, features, circuitry, logic, means, or instructions for storing, in a non-volatile storage component of the memory device, an indication that a remaining life of the memory device satisfies a threshold of remaining life. Some examples of the method 800 and the apparatus described herein may further include operations, features, circuitry, logic, means, or instructions for receiving (e.g., from a host device) a request for status information of the memory device, and transmitting, based on receiving the request for status information, the indication stored in the non-volatile storage component that the remaining life of the memory device satisfies the threshold of remaining life.

Some examples of the method 800 and the apparatus described herein may further include operations, features, circuitry, logic, means, or instructions for performing a third operation at the memory device, comparing a second signal level resulting from the third operation to a second threshold value that may be indicative of the life expectancy of the memory device, and performing the second operation at the memory device based on comparing the signal level resulting from the third operation to the second threshold value that may be indicative of the life expectancy of the memory device.

Figure 9:
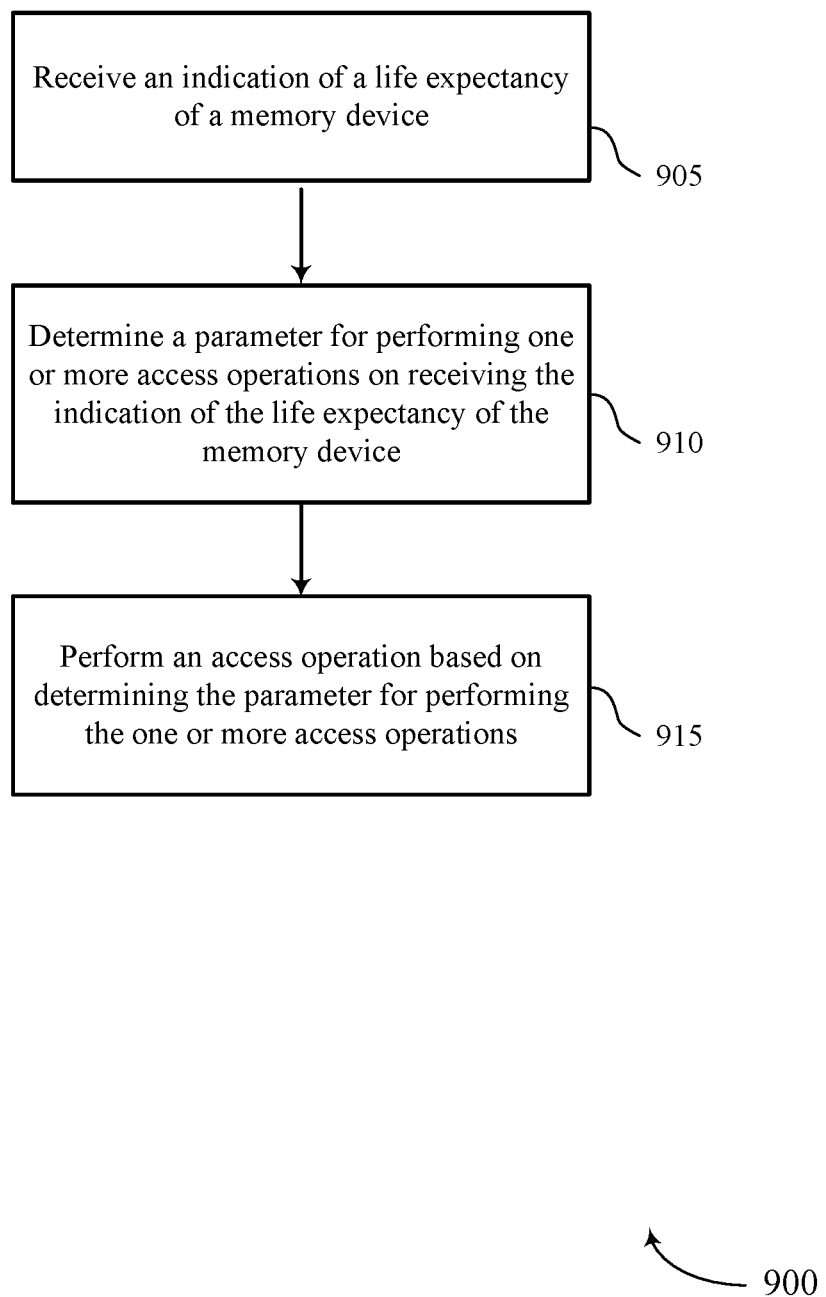

FIG. 9 shows a flowchart illustrating a method or methods 900 that supports life expectancy monitoring for memory devices in accordance with aspects of the present disclosure. The operations of method 900 may be implemented by a host device or its components as described herein. For example, the operations of method 900 may be performed by a host device as described with reference to FIG. 7. In some examples, a host device may execute a set of instructions to control the functional elements of the host device to perform the described functions. Additionally or alternatively, a host device may perform aspects of the described functions using special-purpose hardware.

At 905, the host device may receive an indication of a life expectancy of a memory device (e.g., from the memory device). The operations of 905 may be performed according to the methods described herein. In some examples, aspects of the operations of 905 may be performed by a status reception component as described with reference to FIG. 7.

At 910, the host device may determine a parameter for performing one or more access operations (e.g., on the memory device, on another memory device) based on receiving the indication of the life expectancy of the memory device. The operations of 910 may be performed according to the methods described herein. In some examples, aspects of the operations of 910 may be performed by a memory access management component as described with reference to FIG. 7.

At 915, the host device may perform an access operation (e.g., on the memory device, on another memory device) based on determining the parameter for performing the one or more access operations. The operations of 915 may be performed according to the methods described herein. In some examples, aspects of the operations of 915 may be performed by an access operation component as described with reference to FIG. 7.

In some examples, an apparatus as described herein may perform a method or methods, such as the method 900. The apparatus may include features, circuitry, logic, means, or instructions (e.g., a non-transitory computer-readable medium storing instructions executable by a processor) for receiving an indication of a life expectancy of a memory device (e.g., from the memory device), determining a parameter for performing one or more access operations (e.g., on the memory device, on another memory device) based on receiving the indication of the life expectancy of the memory device, and performing an access operation (e.g., on the memory device, on another memory device) based on determining the parameter for performing the one or more access operations.

In some examples of the method 900 and the apparatus described herein, determining the parameter for performing the one or more access operations may include operations, features, circuitry, logic, means, or instructions for determining to change a parameter for operating the memory device based on receiving the indication of the life expectancy of the memory device.

In some examples of the method 900 and the apparatus described herein, determining the parameter for performing the one or more access operations may include operations, features, circuitry, logic, means, or instructions for determining to refrain from performing an access operation (e.g., a second access operation) on the memory device based on receiving the indication of the life expectancy of the memory device. Some examples of the method 900 and the apparatus described herein may further include operations, features, circuitry, logic, means, or instructions for determining to perform the access operation (e.g., the second access operation) using a second memory device based on receiving the indication of the life expectancy of the memory device.

Some examples of the method 900 and the apparatus described herein may further include operations, features, circuitry, logic, means, or instructions for transmitting an indication of a status of the memory device to a device different than the memory device based on receiving the indication of the life expectancy of the memory device.

Some examples of the method 900 and the apparatus described herein may further include operations, features, circuitry, logic, means, or instructions for determining that a degradation of the memory device satisfies a threshold degradation based on comparing the indication of the life expectancy to a threshold associated with an age or operating history of the memory device, and transmitting the indication of the status of the memory device may be based on determining that the degradation of the memory device satisfies the threshold degradation.

Some examples of the method 900 and the apparatus described herein may further include operations, features, circuitry, logic, means, or instructions for determining an estimated life expectancy parameter associated with an age or operating history of the memory device, and determining the parameter for performing the one or more access operations on the memory device based on comparing the indication of the life expectancy of the memory device to the estimated life expectancy parameter.

In some examples of the method 900 and the apparatus described herein, receiving the indication of the life expectancy may include operations, features, circuitry, logic, means, or instructions for receiving an indication of an estimated percentage of remaining life of the memory device, or an indication of an estimated duration of remaining life of the memory device, or an indication that an estimate of remaining life of the memory device satisfies a threshold of remaining life.

In some examples of the method 900 and the apparatus described herein, receiving the indication of the life expectancy of the memory device may include operations, features, circuitry, logic, means, or instructions for polling a non-volatile storage component of the memory device.

It should be noted that the methods described above describe possible implementations, and that the operations and the steps may be rearranged or otherwise modified and that other implementations are possible. Furthermore, portions from two or more of the methods may be combined.

An apparatus is described. The apparatus may include a memory array having a set of memory cells and circuitry coupled with the memory array. The circuitry may be operable to perform a first operation (e.g., in response to at least one of a refresh command, an activate command, a read command, a write command, or a power-up sequence, or any combination thereof), compare a signal level resulting from the first operation to a threshold value that is indicative of a life expectancy of the apparatus, and perform a second operation based on comparing the signal level resulting from the first operation to the threshold value that is indicative of the life expectancy of the apparatus.

In some examples, the signal level resulting from the first operation includes a voltage resulting from the first operation and, to compare the signal level to the threshold value, the circuitry may be operable to compare the voltage resulting from the first operation to a voltage threshold that is indicative of the life expectancy of the apparatus.

In some examples, the signal level resulting from the first operation includes a duration associated with performing the first operation and, to compare the signal level to the threshold value, the circuitry may be operable to compare the duration associated with performing the first operation to a duration threshold that is indicative of the life expectancy of the apparatus.

In some examples, the circuitry may be operable to determine, based on comparing the signal level resulting from the first operation to the threshold value, an estimated percentage of remaining life of the apparatus, or an estimated duration of remaining life of the apparatus, or determining that an estimate of remaining life of the apparatus satisfies a threshold of remaining life.

In some examples, the threshold value may be associated with an age or an operating history of the apparatus, and the circuitry may be operable to determine that a degradation of the apparatus satisfies a threshold degradation based on comparing the signal level resulting from the first operation to the threshold value.

Another apparatus is described. The apparatus may include circuitry configured for coupling with a memory device. The circuitry may be operable to receive (e.g., from the memory device), an indication of a life expectancy of the memory device, determine a parameter for performing one or more access operations (e.g., on the memory device, on a different memory device) based on receiving the indication of the life expectancy of the memory device, and perform an access operation (e.g., on the memory device, on a different memory device) based on determining the parameter for performing the one or more access operations.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
   performing a first operation at a memory device in response to at least one of a refresh command, an activate command, a read command, a write command, or a power-up sequence, or any combination thereof;
   comparing a signal level resulting from the first operation to a threshold value that is indicative of a remaining life expectancy of the memory device, the threshold value based at least in part on an age or an operating history of the memory device; and
   performing a second operation at the memory device based at least in part on comparing the signal level resulting from the first operation to the threshold value that is indicative of the remaining life expectancy of the memory device.

2. The method of claim 1, wherein:
   the signal level resulting from the first operation comprises a voltage resulting from the first operation; and
   comparing the signal level to the threshold value comprises comparing the voltage resulting from the first operation to a voltage threshold that is indicative of the remaining life expectancy of the memory device.

3. The method of claim 1, wherein:
   the signal level resulting from the first operation comprises a duration associated with performing the first operation; and
   comparing the signal level to the threshold value comprises comparing the duration associated with performing the first operation to a duration threshold that is indicative of the remaining life expectancy of the memory device.

4. The method of claim 1, further comprising:
   determining, based at least in part on comparing the signal level resulting from the first operation to the threshold value, an estimated percentage of remaining life of the memory device, or an estimated duration of remaining life of the memory device, or that an estimate of remaining life of the memory device satisfies a threshold of remaining life.

5. The method of claim 1, further comprising:
   determining that a degradation of the memory device satisfies a threshold degradation based at least in part on comparing the signal level resulting from the first operation to the threshold value.

6. The method of claim 1, wherein performing the second operation at the memory device comprises:
   adjusting a voltage parameter of the memory device, a timing parameter of the memory device, or both based at least in part on comparing the signal level resulting from the first operation to the threshold value.

7. The method of claim 1, wherein performing the second operation at the memory device comprises:

disabling a first circuit component of the memory device based at least in part on comparing the signal level resulting from the first operation to the threshold value; and enabling a second circuit component of the memory device based at least in part on comparing the signal level resulting from the first operation to the threshold value.

8. The method of claim 1, wherein performing the second operation at the memory device comprises:

signaling, to a host device coupled with the memory device, a status of the memory device based at least in part on comparing the signal level resulting from the first operation to the threshold value.

9. The method of claim 8, wherein signaling the status of the memory device comprises:

signaling an indication that a remaining life of the memory device satisfies a threshold of remaining life.

10. The method of claim 1, wherein performing the second operation at the memory device comprises storing, in a non-volatile storage component of the memory device, an indication that a remaining life of the memory device satisfies a threshold of remaining life, the method further comprising:

receiving, from a host device, a request for status information of the memory device; and transmitting, based at least in part on receiving the request for status information, the indication stored in the non-volatile storage component that the remaining life of the memory device satisfies the threshold of remaining life.

11. The method of claim 1, further comprising:

performing a third operation at the memory device;

comparing a second signal level resulting from the third operation to a second threshold value that is indicative of a second remaining life expectancy of the memory device; and performing the second operation at the memory device based at least in part on comparing the second signal level resulting from the third operation to the second threshold value that is indicative of the second remaining life expectancy of the memory device.

12. A method, comprising:

receiving, from a memory device, an indication of a remaining life expectancy of the memory device;

determining an estimated life expectancy parameter associated with an age or operating history of the memory device;

determining a parameter for performing one or more access operations on the memory device based at least in part on comparing the indication of the remaining life expectancy of the memory device to the estimated life expectancy parameter; and performing an access operation on the memory device based at least in part on determining the parameter for performing the one or more access operations.

13. The method of claim 12, wherein determining the parameter for performing the one or more access operations on the memory device comprises:

determining to change a parameter for operating the memory device based at least in part on receiving the indication of the remaining life expectancy of the memory device.

14. The method of claim 12, wherein determining the parameter for performing the one or more access operations on the memory device comprises:

determining to refrain from performing a second access operation on the memory device based at least in part on receiving the indication of the remaining life expectancy of the memory device.

15. The method of claim 14, further comprising:

determining to perform the second access operation using a second memory device based at least in part on receiving the indication of the remaining life expectancy of the memory device.

16. The method of claim 12, further comprising:

transmitting an indication of a status of the memory device to a device different than the memory device based at least in part on receiving the indication of the remaining life expectancy of the memory device.

17. The method of claim 16, further comprising:

determining that a degradation of the memory device satisfies a threshold degradation based at least in part on comparing the indication of the remaining life expectancy to a threshold associated with an age or operating history of the memory device, wherein transmitting the indication of the status of the memory device is based at least in part on determining that the degradation of the memory device satisfies the threshold degradation.

18. The method of claim 12, wherein receiving the indication of the remaining life expectancy comprises:

receiving an indication of an estimated percentage of remaining life of the memory device, or an indication of an estimated duration of remaining life of the memory device, or an indication that an estimate of remaining life of the memory device satisfies a threshold of remaining life.

19. The method of claim 12, wherein receiving the indication of the remaining life expectancy of the memory device comprises:

polling a non-volatile storage component of the memory device.

20. An apparatus, comprising:

a memory array comprising a plurality of memory cells; and circuitry coupled with the memory array and operable to:

perform a first operation in response to at least one of a refresh command, an activate command, a read command, a write command, or a power-up sequence, or any combination thereof;

compare a signal level resulting from the first operation to a threshold value that is indicative of a remaining life expectancy of the apparatus, the threshold value based at least in part on an age or an operating history of the apparatus; and perform a second operation based at least in part on comparing the signal level resulting from the first operation to the threshold value that is indicative of the remaining life expectancy of the apparatus.

21. The apparatus of claim 20, wherein:

the signal level resulting from the first operation comprises a voltage resulting the first operation; and to compare the signal level to the threshold value, the circuitry is operable to compare the voltage resulting from the first operation to a voltage threshold that is indicative of the remaining life expectancy of the apparatus.

22. The apparatus of claim 20, wherein:

the signal level resulting from the first operation comprises a duration associated with performing the first operation; and to compare the signal level to the threshold value, the circuitry is operable to compare the duration associated with performing the first operation to a duration threshold that is indicative of the remaining life expectancy of the apparatus.

23. The apparatus of claim 20, wherein the circuitry is further operable to:

determine, based at least in part on comparing the signal level resulting from the first operation to the threshold value, an estimated percentage of remaining life of the apparatus, or an estimated duration of remaining life of the apparatus, or that an estimate of remaining life of the apparatus satisfies a threshold of remaining life.

24. The apparatus of claim 20, wherein the circuitry is further operable to:

determine that a degradation of the apparatus satisfies a threshold degradation based at least in part on comparing the signal level resulting from the first operation to the threshold value.

25. An apparatus, comprising:

circuitry configured for coupling with a memory device, the circuitry operable to:

receive, from the memory device, an indication of a remaining life expectancy of the memory device;

determine an estimated life expectancy parameter associated with an age or operating history of the memory device;

determine a parameter for performing one or more access operations on the memory device based at least in part on comparing the indication of the remaining life expectancy of the memory device to the estimated life expectancy parameter; and perform an access operation on the memory device based at least in part on determining the parameter for performing the one or more access operations.

* * * * *